(12) United States Patent
Ohazama

(10) Patent No.: US 7,236,624 B2
(45) Date of Patent: Jun. 26, 2007

(54) MARK FOR VISUAL INSPECTION UPON ASSEMBLING A DISPLAY

(75) Inventor: Hidetaka Ohazama, Yamagata-ken (JP)

(73) Assignee: Tohoku Pioneer Corporation, Yamagata (JP)

( * ) Notice: Subject to any disclaimer, the term of this patent is extended or adjusted under 35 U.S.C. 154(b) by 707 days.

(21) Appl. No.: 10/230,264

(22) Filed: Aug. 29, 2002

(65) Prior Publication Data

US 2003/0053056 A1    Mar. 20, 2003

(30) Foreign Application Priority Data

Sep. 14, 2001    (JP) .............................. 2001-279532

(51) Int. Cl.
*G06K 9/00* (2006.01)
*G02F 1/1345* (2006.01)

(52) U.S. Cl. ...................... 382/141; 349/150
(58) Field of Classification Search ........ 382/141–151; 349/149–150
See application file for complete search history.

(56) References Cited

U.S. PATENT DOCUMENTS

| | | | | |
|---|---|---|---|---|
| 4,880,308 A | * | 11/1989 | Shirasu | 356/401 |
| 5,386,309 A | * | 1/1995 | Nam | 349/149 |
| 5,739,887 A | * | 4/1998 | Ueda et al. | 349/149 |
| 6,061,466 A | * | 5/2000 | Takubo et al. | 382/146 |
| 6,190,944 B1 | * | 2/2001 | Choi | 438/109 |
| 6,266,119 B1 | * | 7/2001 | Takahashi et al. | 349/149 |
| 6,950,547 B2 | * | 9/2005 | Floeder et al. | 382/143 |
| 7,043,055 B1 | * | 5/2006 | Silver | 382/103 |

* cited by examiner

*Primary Examiner*—Joseph Mancuso
*Assistant Examiner*—Hadi Akhavannik
(74) *Attorney, Agent, or Firm*—Arent Fox LLP

(57) ABSTRACT

In the neighborhood of each connecting region of a panel substrate, tape automated bonding (TAB) substrates, and a flexible substrate, marks for a visual inspection are provided at a preset distance apart from the connecting region. According to the present marks, inferior products are eliminated with a high rate of accuracy upon visual inspection after completing a connection of display panel.

8 Claims, 4 Drawing Sheets

MARK FOR VISUAL INSPECTION UPON ASSEMBLING A DISPLAY

BACKGROUND OF THE INVENTION

1. Field of the Invention

The present invention relates to a mark for a visual inspection upon assembling a display, and also to an electronic equipment provided with a display panel, a tape automated bonding (TAB) substrate, or a flexible substrate having the mark for the visual inspection thereon, respectively.

The present application claims priority from Japanese Patent Application No. 2001-279532, the disclosure of which is incorporated herein by reference for all purposes.

2. Description of the Related Prior Art

Recently, a portable telephone or a personal digital assistant (PDA) has come into wide use, and needs a display panel which has a small size, reduced thickness, and high display capability. A liquid crystal display panel or an organic electro-luminescent (EL) display panel is employed as the display panel meeting with the requirement.

In order to improve the display capability of such a display panel, an optical control characteristic or a light emission characteristic of each display element, of course, must be improved, and additionally it is also an important factor to bond electronic parts onto the display panel with high accuracy.

With reference to FIG. 5, the conventional bonding process of the electronic parts onto the display panel will be described. The electronic parts such as the TAB substrate and a flexible printed circuit (FPC) are connected onto the display panel. Here, the connection between the display panel and the TAB substrate will be explained as an example.

A panel substrate 51 of a display panel 50 has leads 51a of the display panel 50 to be exposed at an end portion of the substrate 51. The leads 51a are connected to leads 52a of the TAB substrate 52 through an anisotropic conductive film (ACF) 53. Alignment marks 51b are provided on lateral both sides of a connecting region formed by the leads 51a of the panel substrate 51. Likewise, alignment marks 52b are provided on the TAB substrate 52 to fit with the alignment marks 51b. A photograph of these alignment marks 51b and 52b is taken by an image pickup device 54, and is observed by an enlargement thereof or image-processing. In such a way, positioning is regulated by a regulating mechanism (not shown) so as to bring the positions of the both display panel 50 and the TAB substrate 52 into a predetermined position-relationship therebetween.

After completing the positioning, the end portion of the panel substrate 51 is overlapped with an end portion of the TAB substrate 52 through the ACF 53. The overlapped portion is pressed down by a temporary pressure-bonding head 55. Thus, the both panel substrate 51 and the TAB substrate 52 are temporarily bonded, putting the ACF 53 between the both.

After, then, completing the temporary bonding, the positioning of the alignment marks and also dust or the like to be adhered on the panel are inspected. Only the display panel which passed in these inspections is conveyed into a permanent pressure-bonding process. In the permanent pressure-bonding process, a predetermined temperature and pressure is applied to the temporary bonding portion during a predetermined time, thereby permanently bonding the panel substrate 51 with the TAB substrate 52.

Even if the positioning is performed by using the above-mentioned alignment marks and image processing of the alignment marks through the image pickup device, it is very difficult to perform perfect positioning of each lead disposed with high density since there may be any problem of resolution ability in a photographic image, or any formation error of a substrate glass, the TAB substrate, the FPC, and the like, respectively. In addition, a positional deviation or a pressure-bonding failure may occur in the temporary bonding step or the permanent bonding step after the positioning is performed, so that a connection failure may be caused.

In particular, in the case of a display panel comprising current injection type display elements such as an organic EL display panel, a minute positional deviation causes a contact area formed by connected leads to be decreased, so that there may occur a bad effect to the injected current value. Specifically, even if the connection between each lead is secured, the display performance may be deteriorated due to reduction of the contact area. Comparing with a liquid crystal display panel or the like to be driven by a voltage, the organic EL display panel requires strict accuracy of the positioning. Then, in the case of the organic EL display panel, a visual inspection is performed after the panel substrate is permanently bonded with pressure to the TAB substrate in order to firstly eliminate inferior products which can be visually found out. Further, a microscopic inspection is performed to the remaining products in order to inspect whether the contact area between leads is appropriately secured.

Here, since the microscopic inspection is a work with high load, it is preferable that the inferior products are eliminated in the visual inspection prior to the microscopic inspection as much as possible, and as a result, the objects of the microscopic inspection should be decreased. However, it is impossible for the visual inspection to perfectly examine to see whether the contact area between the leads is under a good or bad condition. In addition, the above-mentioned alignment marks also for regulating the position of the both substrates are too small to find the inferior products by the visual inspection. Thus, in a conventional way, only inferior products having obvious problems such as a distinct pressure-bonding failure can be eliminated by the visual inspection step. As a result, the workload in the microscopic inspection step can not be reduced.

SUMMARY OF THE INVENTION

The present invention is proposed to overcome such a problem, and has an object that the inferior products can be eliminated with high accuracy in the visual inspection step to reduce the workload in the microscopic inspection step as much as possible.

According to the present invention, there is provided marks for a visual inspection formed at a connecting portion where at least two of a panel substrate, a tape automated bonding substrate, and a flexible substrate are connected each other in order to visually check a connection failure of the connecting portion, wherein each mark provided on each substrate is combined at the connecting portion to form a pair of marks, and the connection failure is checked by a deviation between the pair of marks which may occur after connecting each substrate.

According to the present invention, there is provided marks for a visual inspection formed at a connecting portion where at least two of a panel substrate, a tape automated bonding substrate, and a flexible substrate are connected each other in order to visually check a connection failure of the connecting portion, wherein the marks are located at a position where they are just a preset distance away from a connecting region of the connecting portion on each substrate in a longitudinal direction of the connecting region, each mark provided on each substrate is combined at the connecting portion to form a pair of marks, and the connection failure is checked by a deviation between the pair of marks which may occur after connecting each substrate.

According to the present invention, the connection failure is checked due to the deviations in the longitudinal direction or a direction perpendicular to the longitudinal direction, or an angular deviation in the longitudinal direction, between the pair of marks.

According to the present invention, the marks are provided in a lateral symmetry to a central shaft of each connecting region, and the connection failure based on an angle deviation between the connected substrates is checked due to the deviations between the pair of marks in a direction perpendicular to the longitudinal direction.

According to the present, there is provided an electronic equipment having a display panel including a panel substrate, a tape automated bonding substrate, and a flexible substrate, all the substrates being provided with marks for a visual inspection thereon.

The present inventions comprising the above features have the following effects.

That is, the conventional alignment marks are provided at the connecting portion of each substrate for positioning when connecting the panel substrate, the tape automated bonding substrate, and the flexible substrate each other, but can not be employed as marks for the visual inspection for checking the connection failure after connecting them since the alignment marks are too small. On the other hand, the marks for the visual inspection of the present invention enlarge the positional deviation which may occur at the connecting region in the longitudinal direction after the connection to enable the positional deviation to be converted into the deviation of the pair of marks for the visual inspection. In short, since the connection failure is checked by the enlarged deviation of the marks for the visual inspection while the deviation of the connecting region itself is delicate by just the sense of sight, the inspection objects sent to the microscope inspection process can be decreased, so that the effective inspection work can be caused.

Such a function of the marks for the visual inspection can be accomplished based on that the marks are formed a preset distance apart from the connecting region at each connecting portion of the panel substrate, the tape automated bonding substrate, and the flexible substrate, in the longitudinal direction. Since the marks for the visual inspection are located at such a position, the delicate angular deviation between the substrates to be connected can be converted into a large deviation amount in a direction perpendicular to the longitudinal direction to recognize the positional deviation at the connecting portion through enlarging it. In addition, since the marks for the visual inspection are provided in a lateral symmetry to the connecting portion, the direction and the amount of the deviation enable the angular deviation at the connecting portion to be further clearly recognized.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENT

Figure 1:
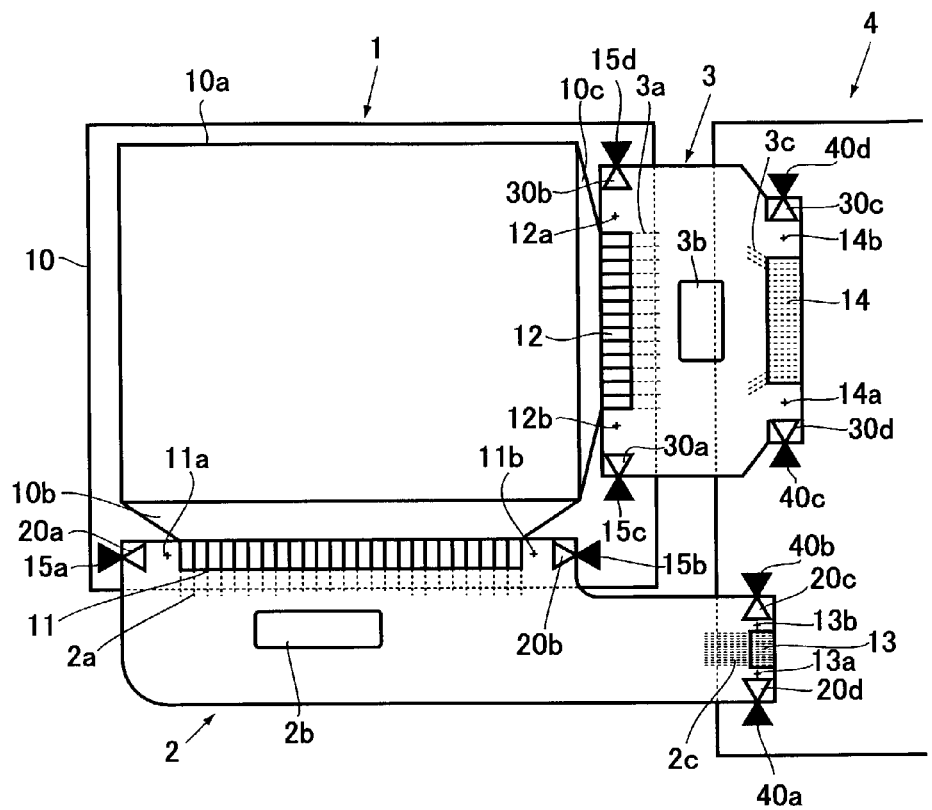
FIG. 1 is an explanatory view showing an embodiment of the present invention, in which electronic parts are mounted on a display panel.

FIG. 1 is an explanatory view showing one embodiment of the present invention, with regard to mounting electronic parts on a display panel. An organic EL display panel 1, TAB substrates 2, 3, and a flexible substrate 4 are shown in the drawing.

In a panel substrate 10 of the organic EL display panel 1, leads 10b, 10c are drawn out as signal lines from a display area 10a. These leads 10b, 10c are respectively converged, and connected with each lead 2a, 3a of the TAB substrates 2, 3 at each connecting region 11, 12. Driving integrated Circuits 2b, 3b are mounted on the TAB substrates 2, 3, respectively.

Leads 2c, 3c of the TAB substrates 2, 3 existing at a side of the flexible substrate 4 are connected to connecting lines of the flexible substrates 4 at connecting regions 13, 14 on the flexible substrate 4. In the neighborhood of the connecting regions 11, 12, 13, and 14, alignment marks 11a, 11b, 12a, 12b, 13a, 13b, 14a, and 14b are provided on the panel substrate 10, the TAB substrates 2, 3 and the flexible substrate 4, respectively.

In one embodiment of such a display panel, marks for a visual inspection are provided on the panel substrate 10, the TAB substrates 2, 3, and the flexible substrate 4, respectively. The marks 15a, 15b, 15c, and 15d for the visual inspection are provided on the panel substrate 10, the marks 20a, 20b, 20c, and 20d on the TAB substrate 2, the marks 30a, 30b, 30c, and 30d on the TAB substrate 3, and the marks 40a, 40b, 40c, and 40d on the flexible substrate 4.

These marks for the visual inspection are located at each right and left neighborhood of the connecting regions 11, 12, 13, and 14. Also, they are provided in a lateral symmetry to a central shaft of each connecting region under an accurate bonding condition, respectively. As shown in FIG. 1, each mark is formed by a triangular shape, and is combined so as to make a pair between connected substrates, wherein a tip of each mark is confronted with each other, and each side directed toward the tips of the pair of marks is in alignment with each other if the connecting situation is accurate. Specifically, each mark is positioned so as to allow a situation to be easily recognized in the sense of sight as described above to become an accurate connecting situation. In order to obtain such positioning, each tip of marks for the visual inspection may be located, for example, along a straight line connecting alignment marks of each substrate.

Next, a function of marks for the visual inspection will be explained referring to FIGS. 2, which is an explanatory view enlarging a right side of the connecting region 11. The mark 15b for the visual inspection is provided on an axis which is formed by connecting alignment marks 11a and 11b at the side of panel substrate 10. On the other hand, the mark 20b for the visual inspection is provided on an axis which is formed by connecting alignment marks 11a and 11b at the side of TAB substrate 2. Here, assume that an angular deviation θ appears when connecting the leads 10b of the panel substrate 10 with the leads 2a of the TAB substrate 2 at the connecting region 11. In this case, the area of contact, which is formed by the leads 10b and 2a, is shown by oblique lines. Comparing with the accurate connecting situation, the area of contact is considerably reduced. In the case of organic EL display panel 1, such an angular deviation between the connecting substrates gives a bad effect to the display performance, and thus must be eliminated in an inspection step. However, in the case of the positional deviation under the delicate degree as shown in FIG. 2, it is not easy to clearly grasp the situation of the positional deviation just by visually inspecting the connecting region 11 and the alignment marks 11b.

Figure 2:
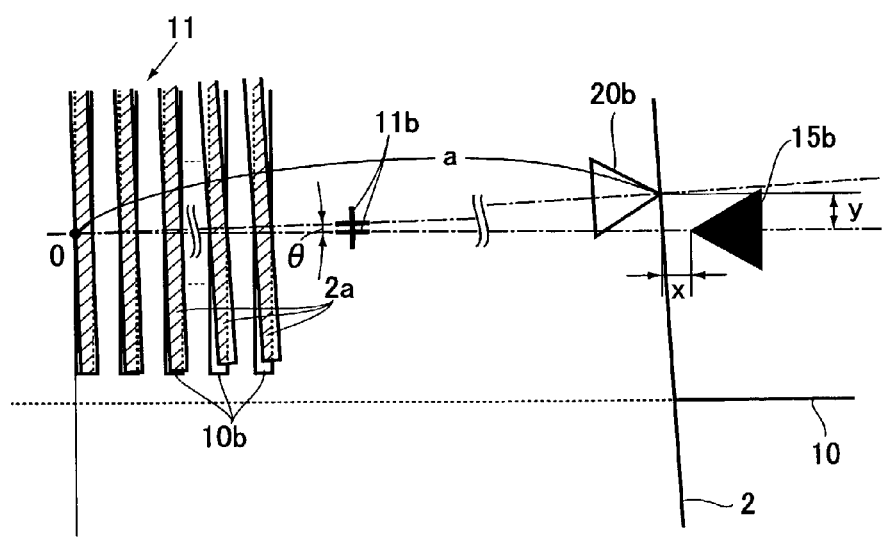
FIG. 2 is an explanatory view showing a function of marks for a visual inspection in FIG. 1.

In order to settle this problem, as shown in FIG. 2, the marks 20b for the visual inspection are provided at a position where they are just a preset distance, i.e., a away from a central position O of the connecting region 11 in the longitudinal direction of the connecting region, thereby enabling the delicate angular deviation θ to be recognized through a deviation amount y in a direction perpendicular to the longitudinal direction with an enlargement, wherein y=a x sin θ. Due to the deviation amount to be recognized, the connection failure over a certain level can be surely eliminated by the visual inspection. Moreover, the preset distance a may be appropriately set based on the relationship between the angular deviation θ to be allowable and a minimum value of the deviation amount y to be visually found out.

In addition, assuming the case of a positional deviation in the longitudinal direction of the connecting region differently from the angular deviation as described above, the deviation can be recognized as a gap x between the tips of the marks 15b and 20b for the visual inspection as shown in FIG. 2. In other words, even if each tip of the marks 15b and 20b for the visual inspection is located on the same axis as described above, the positional deviation can be recognized due to that each side directed toward the tips of the pair of marks is not in alignment with each other. Specifically, the positional deviation can be recognized by some ways.

Figure 3:
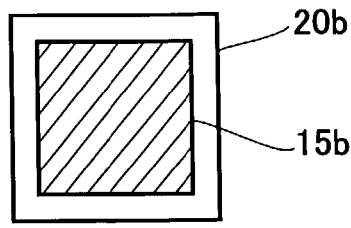
FIGS. 3a–3e are explanatory views showing the other embodiments of the marks used for visual inspection.
Figure 3:
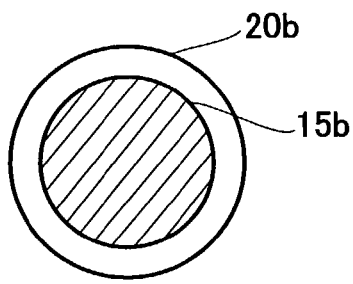
Figure 3:
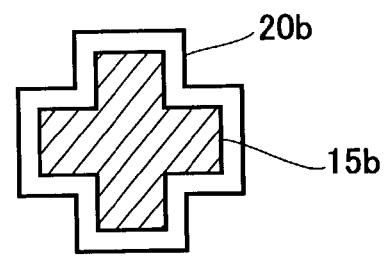
Figure 3:
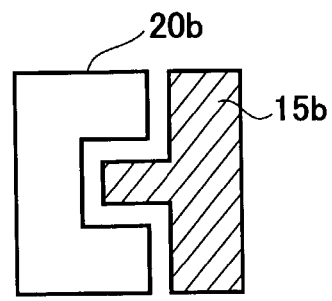
Figure 3:
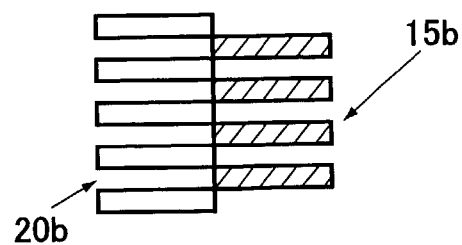

The shape or locating position of the marks for the visual inspection are not limited to the above-mentioned embodiment. FIGS. 3a–3e illustrate some examples having an appropriate shape as a mark for the visual inspection. The most appropriate shape of mark is generally determined based on a pitch of an electrode (lead), a shape of a glass substrate, an allowable error for attaching the glass substrate with the FPC or TAB substrate, a method of the visual inspection, or the degree of skill. The reference numerals in FIGS. 3a–3e correspond to ones of marks for the visual inspection as shown in FIG. 2. One mark 15b is provided on the panel substrate 10, and another mark 20b on the TAB substrate 2. In FIGS. 3a, 3b, and 3c, a square, a circle, and a cross shape are used as the mark, respectively, wherein the mark 20b is provided on the TAB substrate 2 which is formed by transparent or semitransparent material, while the mark 15b as shown with oblique lines is provided on the panel substrate 10. In these embodiments, the connection failure can be found out through imbalance of a gap formed by the two marks 15b, 20b when putting them on top of each other. Further, in FIG. 3d, one mark has a concave portion, and another mark a convex portion, wherein a combination of the concave and convex portions, which is formed by putting the two marks on each other, is utilized for inspecting the connection failure. Also, in FIG. 3e, a plurality of rectangular marks as located with a predetermined interval, respectively, are arranged in confronting the marks 15b with the marks 20b each other, as shown in the same drawing. These marks as shown in FIGS. 3a to 3e have each shape or are positioned so as to easily find the deviation with seeing.

Figure 4:
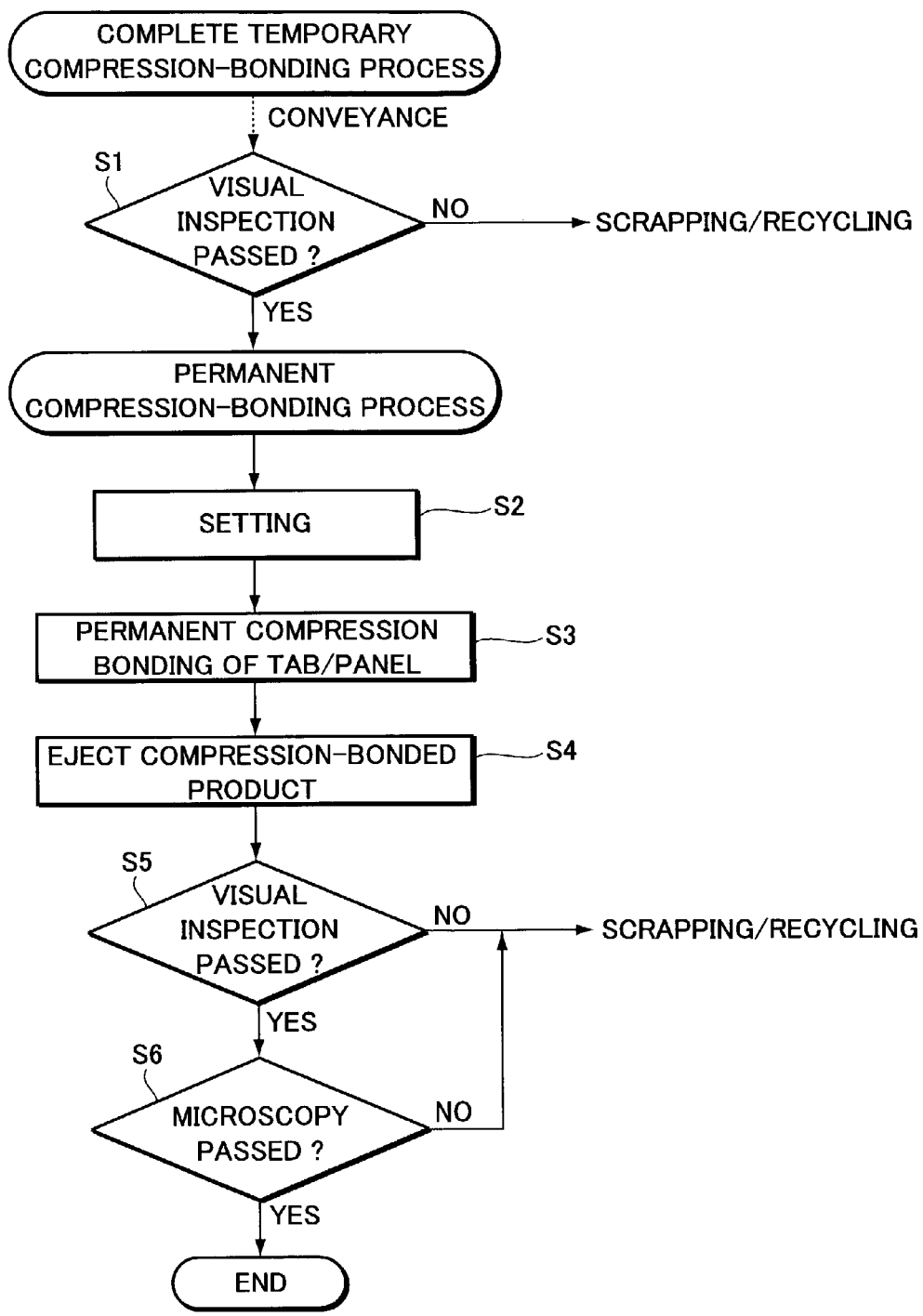
FIG. 4 is a flow chart showing the working steps in an embodiment of the present invention.
Figure 5:
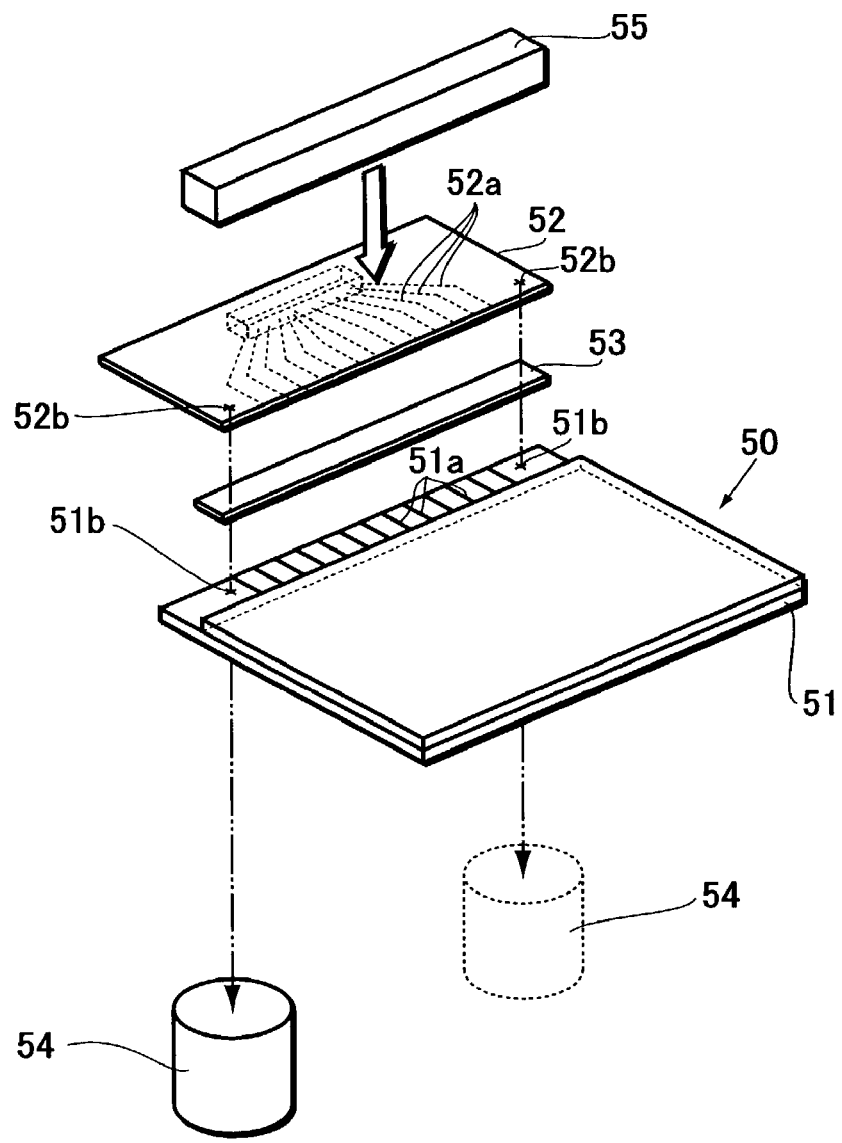
FIG. 5 is an explanatory view showing how to mount the electronic parts on a conventional display panel.

Next, referring to FIG. 4, the working steps of the above-mentioned embodiment will be explained in, as an example, the work for connecting the panel substrate 10 with the TAB substrate 2. As described in the conventional technique also, after completing the temporary pressure-bonding process, the display panel is usually conveyed to a permanent pressure-bonding processing apparatus, but, according to the present invention, the visual inspection is performed once after completing the temporary process at the step S1. The purpose of the visual inspection at this stage is to reduce the workload in the subsequent step, i.e., in a permanent pressure-bonding process, through eliminating inferior products in advance. Specifically, at the step S1, when the visual inspection is passed, the step goes to the permanent pressure-bonding process, but if no, the inferior products are scrapped or recycled. In the permanent pressure-bonding process, the products are set into the permanent pressure-bonding processing apparatus at the step S2. Next, applying a predetermined temperature and pressure onto the part as temporarily bonded during a predetermined time, the connecting region 11 (or 12) connecting the panel substrate 10 with the TAB substrate 2 is permanently bonded with pressure through the ACF at the step S3. After that, the display panel is discharged from the permanent pressure-bonding processing apparatus at the step S4, and further is placed in the visual inspection at the step S5. Whether or not the visual inspection is necessary between each process may be appropriately determined under a consideration of a balance between the quality control and the productivity.

In the visual inspection at this stage, naked eyes, a magnifier with a simple structure, or a TV monitor through the image pickup device may be utilized to confirm the deviation of the mark for the visual inspection. At the step S5, when the visual inspection is passed, the step goes to a microscopic inspection at the step S6, but if no, the inferior products are scrapped or recycled like the step S1. In the microscopic inspection at the step S6, the area of contact formed by each lead of the both substrates in the connecting region 11 (or 12) is checked in detail by a microscopic picture image. If the area of contact meets with a predetermined requirement, the microscopy is passed, and then the process is terminated. If not so, the inferior products are scrapped or recycled like the steps S1 and S5.

According to the present invention, since the marks for the visual inspection is attached on the panel substrate 10, the TAB substrates 2, 3, and the flexible substrate 4, respectively, the possibility of finding out the inferior products by the visual inspection can be increased, so that the objects of the microscopy with much workload can be decreased.

Thus, after the connecting work of the substrates is completed, the inspection according to the present invention allows the inferior products to be eliminated with a high accuracy in the visual inspection process just by applying the marks for the visual inspection. As a result, the workload is reduced in the microscopy, so that the effective inspection work can be caused in the connecting work of the substrates.

While the invention has been described in conjunction with preferred specific embodiment thereof, it will be understood that this description is intended to illustrate and not limit the scope of the invention, which is defined by the following claims.

What is claimed is:

1. An electronic equipment having fabrication alignment marks for using when making connections between at least two of a panel substrate, a tape automated bonding substrate, and a flexible substrate, and visual inspection marks for a visual inspection provided at a connecting portion where said at least two substrates are connected to each other to visually check a connection failure of the connecting portion, wherein:
   each visual inspection mark provided on each substrate is combined with each other at the connecting portion to form a pair of visual inspection marks; and
   the connection failure is visually checked by a deviation between said pair of visual inspection marks after completing fabrication of the substrates.

2. The electronic equipment according to claim 1, wherein:
   the visual inspection marks are located at a preset distance from a connecting region of the connecting portion on each substrate in a longitudinal direction of the connecting region.

3. The electronic equipment according to claim 2, wherein the connection failure is checked due to the deviations in the longitudinal direction or a direction perpendicular to the longitudinal direction, or an angular deviation in the longitudinal direction, between the pair of visual inspection marks.

4. The electronic equipment according to claim 2, wherein the visual inspection marks are provided in a lateral symmetry to a central shaft of each connecting region, and the connection failure based on an angle deviation between the connected substrates is checked due to the deviations in a direction perpendicular to the longitudinal direction.

5. The electronic equipment according to claim 2, wherein each visual inspection mark constituting the pair of visual inspection marks is formed by a triangular shape.

6. The electronic equipment according to claim 2, wherein:
   each visual inspection mark constituting the pair of marks is formed by a square, a circle, or a cross shape; and
   one visual inspection mark of the pairs is provided on one substrate which is formed by transparent material, while another visual inspection mark is provided on the other substrate, said both marks being overlapped each other.

7. The electronic equipment according to claim 1, wherein each visual inspection mark is provided at a peripheral edge and on a corresponding substrate.

8. An electronic equipment having fabrication alignment marks for using when making connections between at least two of a panel substrate, a tape automated bonding substrate, and a flexible substrate, and visual inspection marks for a visual inspection provided at a connecting portion where said at least two substrates are connected to each other to visually check a connection failure of the connecting portion, wherein:
   each visual inspection mark provided on each substrate is combined with each other at the connecting portion to form a pair of visual inspection marks;
   the connection failure is visually checked by a deviation between said pair of visual inspection marks after completing fabrication of the substrates; and
   at least one of said pair of visual inspection marks is located on a straight line connecting said alignment marks on each substrate.

* * * * *